United States Patent
Naraghi et al.

(10) Patent No.: US 9,590,574 B1
(45) Date of Patent: Mar. 7, 2017

(54) PULSE-WIDTH MODULATED (PWM) AUDIO POWER AMPLIFIER WITH OUTPUT TRANSITION SLOPE CONTROL

(71) Applicant: Cirrus Logic, Inc., Austin, TX (US)

(72) Inventors: Shahrzad Naraghi, Austin, TX (US); Johann Gaboriau, Austin, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 247 days.

(21) Appl. No.: 14/176,681

(22) Filed: Feb. 10, 2014

Related U.S. Application Data

(62) Division of application No. 13/327,934, filed on Dec. 16, 2011, now Pat. No. 8,841,894.

(51) Int. Cl.
| | |
|---|---|
| *H02M 3/158* | (2006.01) |
| *H03F 3/217* | (2006.01) |
| *H03F 1/26* | (2006.01) |
| *H03F 3/181* | (2006.01) |

(52) U.S. Cl.
CPC ............ *H03F 3/217* (2013.01); *H03F 1/26* (2013.01); *H03F 3/181* (2013.01)

(58) Field of Classification Search
CPC .......... H03K 17/04206; H03K 17/063; H03K 17/0822; H02M 1/38; H02M 3/156; H02M 3/1588
USPC ........................ 323/282, 284, 289; 327/109
See application file for complete search history.

(56) References Cited

U.S. PATENT DOCUMENTS

| | | |
|---|---|---|
| 5,898,340 A | 4/1999 | Chatterjee et al. |
| 6,344,811 B1 | 2/2002 | Melanson |
| 6,917,504 B2 | 7/2005 | Nguyen et al. |
| 7,078,963 B1 | 7/2006 | Andersen et al. |
| 7,166,992 B2 | 1/2007 | Kudo et al. |
| 7,312,654 B2 | 12/2007 | Roeckner et al. |

(Continued)

FOREIGN PATENT DOCUMENTS

| | | |
|---|---|---|
| WO | WO 0215386 A2 | 2/2002 |

OTHER PUBLICATIONS

U.S. Appl. No. 14/061,912, filed Oct. 24, 2013, Mortazavi, et al.

(Continued)

*Primary Examiner* — Gary L Laxton
(74) *Attorney, Agent, or Firm* — Mitch Harris, Atty at Law, LLC; Andrew M. Harris

(57) ABSTRACT

An audio switching power amplifier having an output with controlled-slope transitions maintains efficiency while avoiding uncontrolled non-overlap intervals during switching transitions. A pair of transistors forming a half-bridge that supplies an output signal at an output terminal of the amplifier are operated so that neither transistor is fully on during an overlap time period. A current source provides an output current to the output terminal during the non-overlap time period to control the output voltage while changing the transistor that conducts the output current from a first one of the pair of transistors to a second one of the pair of transistors. The current source may be provided by operation of one of the transistors in a current source configuration. The voltage of a gate of one of the transistors can be compared with a threshold to provide an indication of the current.

18 Claims, 7 Drawing Sheets

(56) References Cited

U.S. PATENT DOCUMENTS

| | | | |
|---|---|---|---|
| 7,548,097 B2 * | 6/2009 | Dake | H03K 17/04206 323/289 |
| 7,612,550 B2 * | 11/2009 | Usui | G05F 1/56 323/285 |
| 7,777,563 B2 | 8/2010 | Midya et al. | |
| 8,410,855 B2 | 4/2013 | Kim et al. | |
| 8,686,792 B2 | 4/2014 | Sukegawa et al. | |
| 2010/0270989 A1 | 10/2010 | Sasaki et al. | |
| 2011/0187339 A1 | 8/2011 | Trattler et al. | |
| 2012/0139357 A1 | 6/2012 | Teggatz et al. | |

OTHER PUBLICATIONS

Office Action in U.S. Appl. No. 13/327,934 mailed on Dec. 31, 2013, 10 pages (pp. 1-10 in pdf).
U.S. Appl. No. 13/327,934, filed Dec. 16, 2011, Naraghi, et al.
Notice of Allowance in U.S. Appl. No. 13/327,934 mailed on Jul. 3, 2014, 8 pages (pp. 1-8 in pdf).

* cited by examiner

PULSE-WIDTH MODULATED (PWM) AUDIO POWER AMPLIFIER WITH OUTPUT TRANSITION SLOPE CONTROL

This application is a Division of U.S. patent application Ser. No. 13/327,934 filed on Dec. 16, 2011, the disclosure of which is incorporated herein by reference and from which priority is claimed under 35 U.S.C. §121.

BACKGROUND OF THE INVENTION

1. Field of the Invention

The present invention relates generally to integrated circuit switching power amplifiers, and more specifically, to a pulse-width modulated (PWM) power amplifier in which the output is slope-controlled.

2. Background of the Invention

Pulse-width modulated (PWM) switching power amplifiers, referred to as class-D amplifiers, are currently in widespread use in automotive amplifiers and other audio amplifiers. Class D amplifiers are switching power amplifiers and have higher efficiency than linear amplifiers, making them well suited for personal device, automotive and other battery-driven applications and applications where power dissipation in the form of heat is a problem, such as very high power professional audio applications, as in concert halls.

The output stage of a switching power amplifier is typically a half-bridge, or two half-bridges forming a full bridge switching amplifier. The half-bridges are switched in a non-overlapping fashion, in order to avoid conducting through both transistors in the half-bridge, which would otherwise degrade efficiency and require more robust switching devices or increase their failure rate due to the higher conduction requirements. However, operating a half-bridge in a non-overlapping fashion can cause the body diode of one of the transistors to conduct, causing ringing, generating electromagnetic interference (EMI) and wasting energy. Further, the output slope of the amplifier is uncontrolled during the non-overlap interval, which increases distortion.

Therefore, it would be desirable to provide a switching power amplifier having a controlled slope during switching transitions. It would further be desirable to provide a switching power amplifier that can have h-bridges operated in a non-overlapping manner, without generating ringing or excessive EMI.

SUMMARY OF THE INVENTION

The above stated objective of providing a switching power amplifier having controlled slopes during switching transitions, producing reduced EMI, and eliminating ringing among other objectives, is achieved in a switching power amplifier and its method of operation.

The switching power amplifier has a switching output stage including a half-bridge transistor pair coupled to an output terminal of the switching power amplifier, a switching control circuit for controlling the transistors so that neither of the transistors of the pair are biased fully on during a non-overlap time period, and a current source for providing an output current to the output terminal during the non-overlap time period to control the output voltage while changing the transistor that conducts the output current from a first one of the pair of transistors to a second one of the pair of transistors. The current source may be provided by operation of one of the transistors in a current source configuration.

In another aspect of the invention, the switching output stage includes a voltage sensing circuit for comparing a voltage of a gate of at least one of the transistors to another voltage level and providing an output signal to an input of the switching control circuit to provide an indication of the current conducted by the drain of the transistor.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a pulse-width modulated (PWM) audio switching power amplifier circuit and its method of operation. The switching power amplifier has reduced distortion and improved efficiency by using a current source to provide continuity of the output current that is present at the beginning of a non-overlap interval, so that the output voltage is controlled. Controlling the output voltage provides that the body diodes of the switching transistors in the switching power amplifier output stage do not conduct, and so that shoot-through current is minimized. Further, by controlling the slope of the change in the output voltage during the non-overlap interval, distortion and EMI emissions are be reduced. The current source can be the switching transistors themselves, by configuring a particular one of the switching transistors in a diode-connected configuration during at least a portion of the non-overlap interval.

Figure 1:
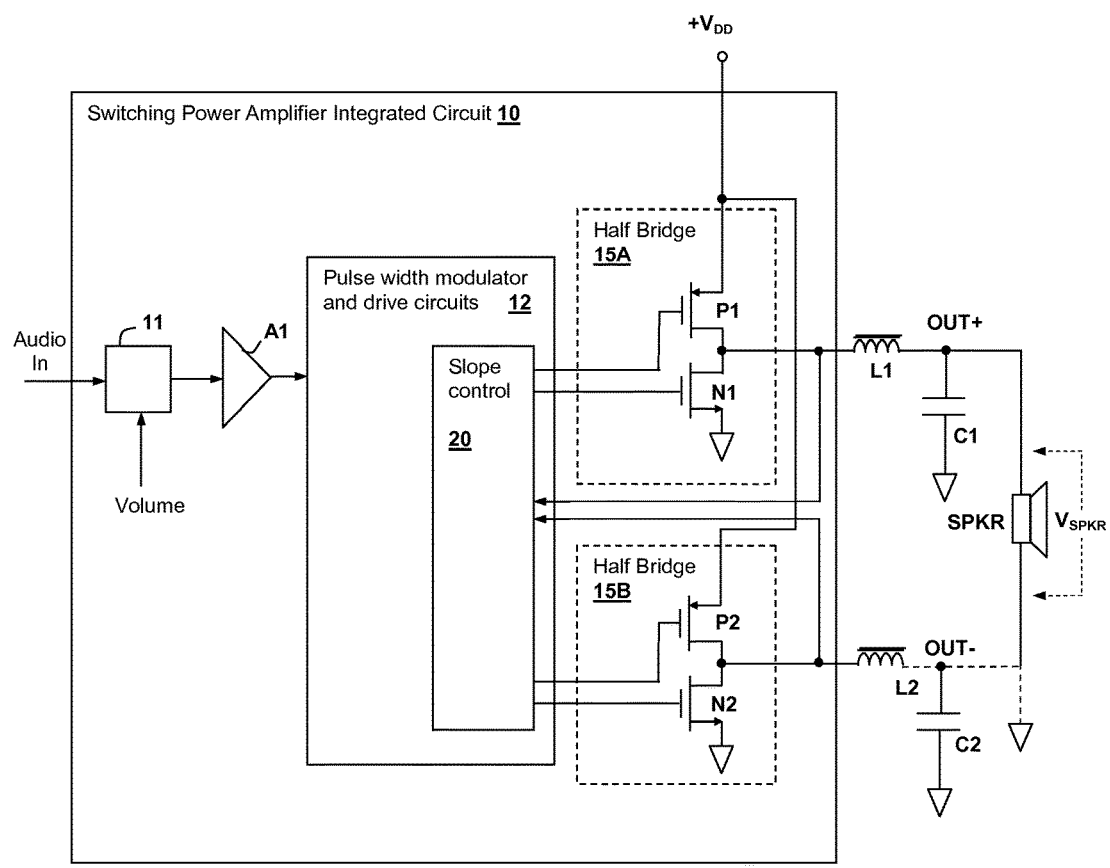
FIG. 1 is a schematic diagram depicting a switching power amplifier circuit in accordance with an embodiment of the present invention.

Referring now to the figures, and in particular to FIG. 1, an audio switching power amplifier integrated circuit 10 is shown, in accordance with an embodiment of the present invention. Switching power amplifier integrated circuit 10 has an input terminal for receiving a voltage source +$V_{DD}$. A transducer, which in the depicted embodiment is a speaker SPKR, but which may be another form of audio transducer, such as headphones or earbuds, is coupled to outputs of audio switching power amplifier integrated circuit 10 by inductors L1 and L2, which deliver respective audio power output signals OUT+,OUT− in the form of pulse waveforms to speaker SPKR. Capacitors C1 and C2 are optional, and assist in reducing EMI generated by the pulses on respective output signals OUT+,OUT−. In some embodiments, inductors L1 and L2 may also be omitted if the inductance of the connections and/or the inductance of speaker SPKR is sufficient for filtering. Audio switching power amplifier integrated circuit 10 receives an analog audio input signal or a digital audio input value at terminal Audio In, and converts the audio waveform represented by the input signal or value to a pulse-width modulated signal in a pulse width modulator and drive circuits block 12. A signal or value received at terminal Audio In is attenuated or amplified according to a volume control value Volume, i.e., the value that sets the gain/attenuation to be applied to the signal or value, by a gain/attenuation block 11. Another amplifier A1 amplifies the value or signal, which is then provided to pulse width modulator and drive circuits block 12.

Signals provided by pulse width modulator and drive circuits block 12 operate transistors N1, N2, P1 and P2, included in half-bridge circuits 15A and 15B, and in particular, slope control circuits 20 within pulse width modulator and drive circuits block 12 operate transistors N1, N2, P1 and P2 in accordance with techniques of the present invention so that during non-overlap intervals, when neither of transistors N1 and P1 are fully-on (and also intervals when neither of transistors N2 and P2 are fully-on), a current source or sink is provided to continue conducting the output current provided at output terminals OUT+ or OUT− of switching power amplifier integrated circuit 10 during the time that neither of the transistors in the corresponding half-bridge 15A, 15B is fully-on. In the depicted embodiment, transistors N1, N2, P1 and P2 are included within audio switching power amplifier integrated circuit 10. However, the present invention includes embodiments in which the switching transistors are external to a controller integrated circuit 10, as the depicted embodiment is understood to be exemplary and not limiting. While the embodiments illustrated herein show "push-pull" configurations for half bridges 15A and 15B, it is understood that the present invention applies equally to full-bridge configurations and that "push-push" (N-N or P-P) half or full-bridge configurations may also be employed.

Figure 2A:
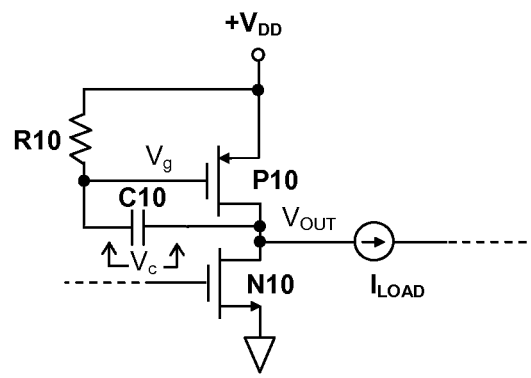
FIGS. 2A-2B are schematic diagrams illustrating operating principles within a switching power amplifier circuit in accordance with an embodiment of the present invention.

Referring now to FIG. 2A, a schematic diagram of a circuit that is provided to facilitate understanding of operating principles in the switching power amplifiers described herein, in a particular phase of operation, is shown in accordance with an embodiment of the invention. A half-bridge circuit formed by transistor P10 and transistor N10 has an output connected to a load (not shown). An output current $I_{LOAD}$ is supplied to the load, and when the non-overlap period begins, the polarity of output current $I_{LOAD}$ is such that current is flowing out of the half-bridge circuit and into the load. Depending on which of transistors N10 or transistor P10 was on prior to the non-overlap interval, the other respective transistor P10 or transistor N10 will be initially selected during the first portion of the non-overlap interval to provide a current source that maintains continuity of output current $I_{LOAD}$ until the transistor conducting output current $I_{LOAD}$ is changed. Resistor R10 provides current to charge capacitor C10, which holds the gate of transistor P10 at a voltage related to the output voltage $V_{OUT}$ at the output of the half-bridge circuit formed by transistors N10 and P10.

Figure 3:
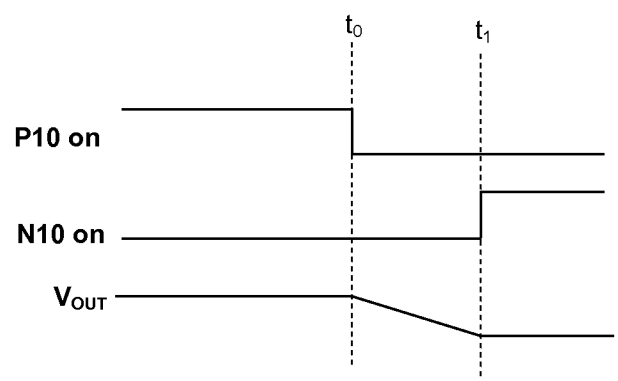
FIG. 3 is a signal waveform diagram depicting signals within the circuit depicted in FIG. 2A.

As long as the voltage at the gate of transistor P10 is started at a voltage such that the current through transistor P10 is substantially equal to output current $I_{LOAD}$ at the beginning of the non-overlap interval, then the feedback provided by transistor P10 will tend to keep the voltage at the gate of transistor P10 at that voltage. Therefore, since the gate voltage ($V_g$) is not changing, the magnitude of the change in the output voltage is the same as the change in the voltage ($V_C$) across capacitor C10 and the following relation holds:

$$dV_C/dt = -dV_{OUT}/dt = I_C/C$$

where C is the capacitance of capacitor C10 and $I_c$ is the current flowing into capacitor C10 from resistor R10. Further, $$I_c = (V_{DD} - V_g)/R$$

where R is the resistance of resistor R10 and $V_{DD}$ is the power supply voltage to which resistor R10 is connected, since the current into the gate of transistor P10 can be presumed to be zero. (As will be seen in further illustration below, capacitor C10 can be provided by the gate capacitance, and in actuality resistor R10 provides the entire external circuitry needed to maintain transistor P10 biased to provide a linearly decreasing output voltage.) Therefore, current $I_c$ flowing into capacitor C10 is substantially constant and the change of output voltage $V_{out}$ will thus be substantially linear. Referring now to FIG. 3, signals within the circuit of FIG. 2A are illustrated. Prior to time $t_0$, transistor P10 is fully on and transistor N10 is fully off. At time $t_0$, transistor N10 remains off and transistor P10 is controlled to cause output voltage $V_{OUT}$ to fall linearly to zero. At time $t_1$ transistor P10 is turned fully-off and transistor N10 is turned on.

Figure 2B:
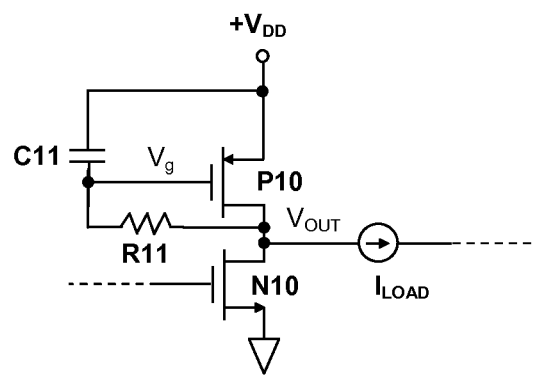

Referring now to FIG. 2B, a schematic diagram of another circuit that illustrates operating principles in another phase of operation of the switching power amplifiers described herein, is shown in accordance with an embodiment of the invention. The circuit of FIG. 2B contains the same half-bridge circuit formed by transistor P10 and transistor N10 in FIG. 2A, and is connected similarly, except for resistor R11 and capacitor C11, which are used to set and hold, respectively, gate voltage $V_g$ at the value that causes the current through transistor P10 to be substantially equal to output current $I_{LOAD}$ at the beginning of the non-overlap interval, as described above with reference to FIG. 2A. Resistor R11 causes transistor P10 to be connected in a diode configuration, so that gate voltage $V_g$ is tracking output voltage $V_{OUT}$. Since output voltage $V_{OUT}$ is changing, gate voltage $V_g$ will also change, and at the time that the current through transistor P10 is substantially equal to output current $I_{LOAD}$, the voltage on the gate of transistor P10 will be held by removing resistor R11, via switching circuits that control the operation of the half-bridge circuits in embodiments of the present invention, as will be described in further detail below.

Figure 4:
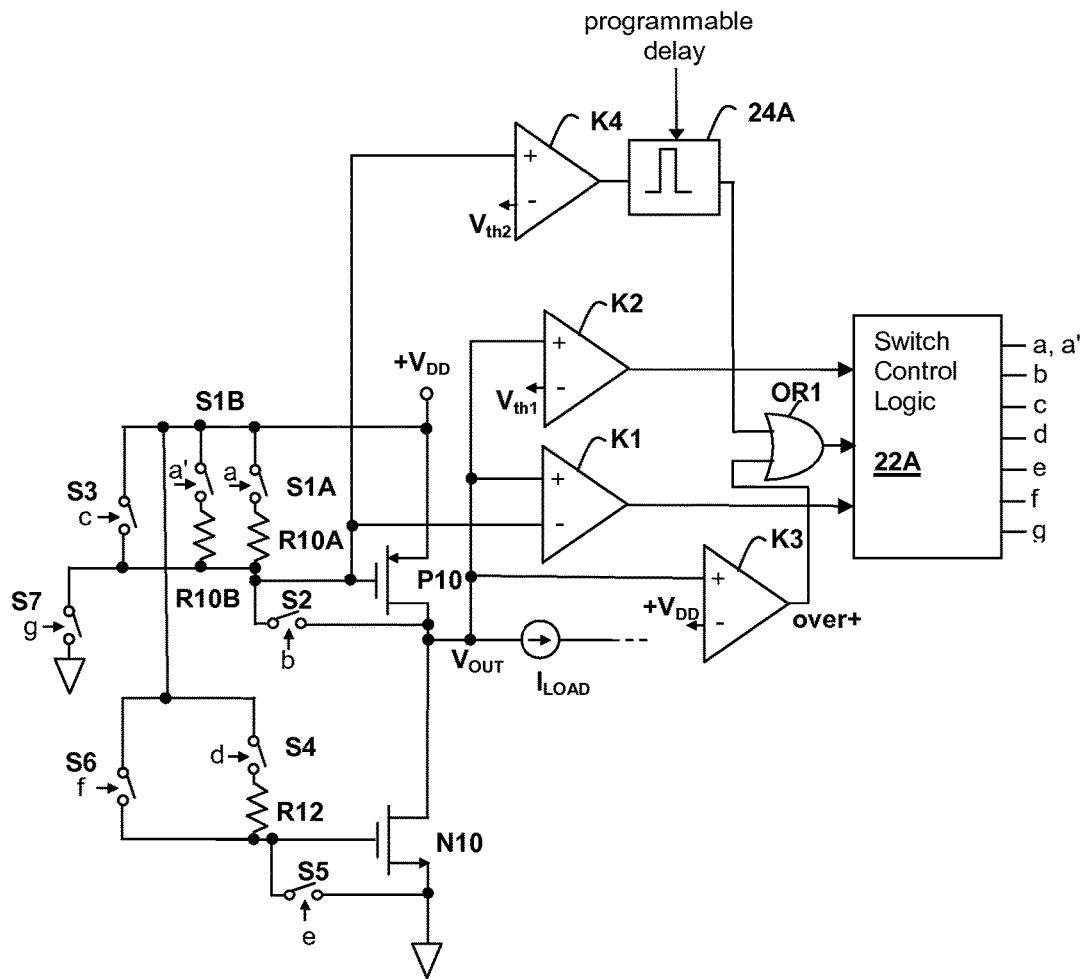
FIG. 4 is a schematic diagram illustrating an output stage of a switching power amplifier circuit in accordance with another embodiment of the present invention.

Referring now to FIG. 4, a half-bridge circuit that forms an output stage of a switching power amplifier in accordance with an embodiment of the present invention, is shown. The half-bridge circuit of FIG. 4 may be used in the switching power amplifier of FIG. 1, providing the functions of half-bridge 15A (and also to provide half-bridge 15B) along with the functions of slope control circuit 20. In the depicted circuit, the function of capacitors C10 and C11 in the illustrative circuits of FIG. 2A and FIG. 2B is provided by the gate capacitance of transistor P10. Resistor R11 is also omitted, since the diode-connected configuration does not require a resistor to operate. Resistor R10A is selectively coupled between power supply voltage $V_{DD}$ and the gate of transistor P10 by a switch S1A and another resistor R10B having a substantially higher resistance than that of resistor R10A is selectively coupled between power supply voltage $V_{DD}$ and the gate of transistor P10 by a switch S1B. Resistor R10A is used to perform essentially the same function as resistor R10 in the circuit of FIG. 2A, while resistor R10B provides for a weaker turn-on of transistor P10, which will be described in further detail below.

The gate of transistor P10 is also selectively coupled to the output terminal of the half-bridge formed by transistors P10 and N10 by a switch S2. A switch S3 is provided to couple the gate of transistor P10 to power supply voltage $V_{DD}$ to turn transistor P10 off quickly when needed. A switch S7 is provided for turning transistor P10 fully on. When the beginning of a non-overlap interval is reached, switch S7 is opened, and switch S2 is turned on to cause gate voltage $V_g$ to track output voltage $V_{OUT}$, coupling the gate and drain of transistor P10, as illustrated by the circuit depicted in FIG. 2B described above. When the current through transistor P10 is substantially equal to output current $I_{LOAD}$, the voltage on the gate of transistor P10 is held by opening switch S2, decoupling the gate and drain of transistor P10. The slope of output voltage $V_{OUT}$ is then controlled by closing switch S1A, which configures transistor P10 so that a linear change in output voltage $V_{OUT}$ is maintained, as illustrated by the circuit of FIG. 2A described above. A comparator K1, which may be a Schmitt trigger or other hysteresis comparator, compares the gate voltage $V_g$ of transistor P10 with output voltage $V_{OUT}$ and once the internal hysteresis threshold of comparator K1 is exceeded, the output of comparator K1 assumes a logical high value, which signals switch control logic 22A to open switch S2 and close switch S1A as described above. The value of resistor R10A in conjunction with the gate capacitance of transistor P10 controls the rate of change of output voltage $V_{OUT}$.

Figure 5:
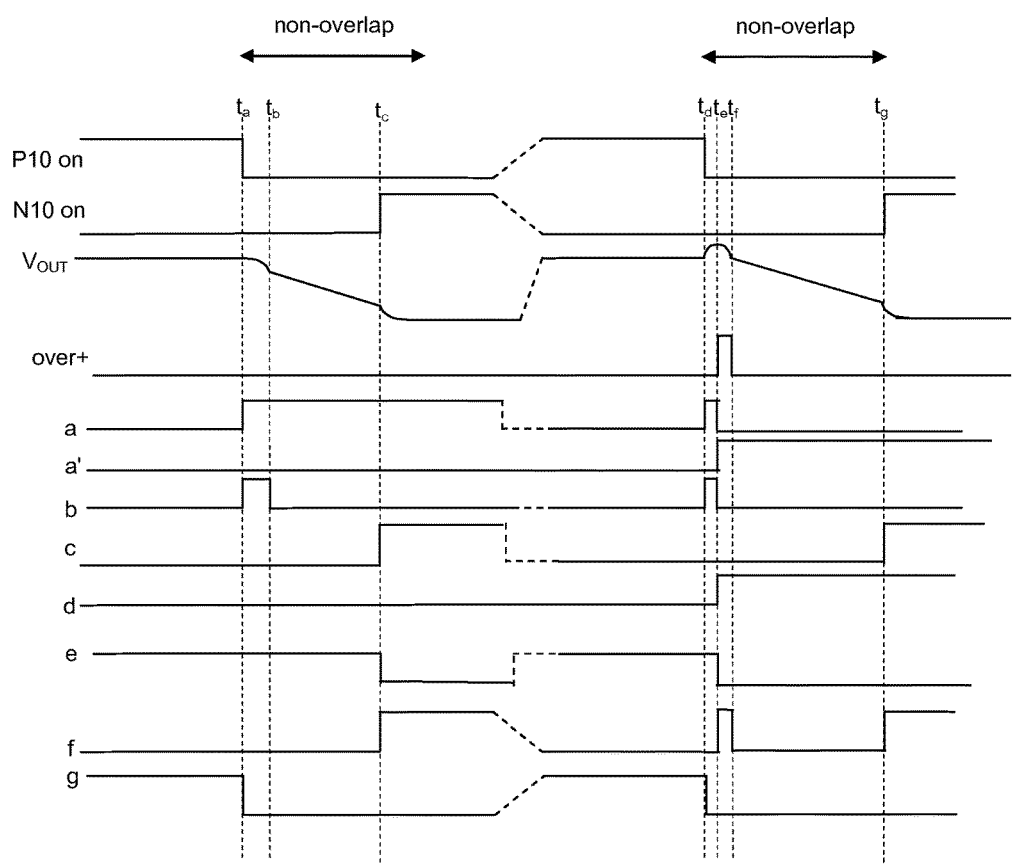
FIG. 5 is a signal waveform diagram depicting signals within the circuit depicted in FIG. 4.

Referring additionally to FIG. 5, operation of the circuit of FIG. 4 is illustrated in a waveform and timing diagram depicting signals within the circuit of FIG. 4. At time $t_a$, the non-overlap interval begins when the fully-on state of transistor P10 is terminated by de-asserting control signal g to open switch S7. At time $t_a$, control signal e is maintained in an active state to keep transistor N10 turned off during the non-overlap interval. Also at time $t_a$, switch S2 is closed by asserting control signal b, and switch S1A is also closed by asserting control signal a. When output voltage $V_{OUT}$ has dropped to a voltage at which comparator K1 changes state at time $t_b$, control signal b is de-asserted to open switch S2, and control signal a remains asserted to keep switch S1A closed so that the slope of output voltage $V_{OUT}$ is controlled by transistor P10 being biased to operate as a current source by resistor R10A. Once comparator K2, which compares output voltage $V_{OUT}$ to a predetermined threshold voltage $V_{th1}$, e.g., 600 mV, changes state at time $t_c$, switch control logic 22A is signaled to assert control signals c and f at time $t_c$, which close switches S3 and S6, respectively, terminating the non-overlap interval. Closing switch S3 pulls the gate of transistor P10 to power supply voltage $V_{DD}$, turning transistor P10 fully off, while closing switch S6 pulls the gate of transistor N10 to power supply voltage $V_{DD}$, turning transistor N10 fully on. Comparator K2 thus provides an indication that output voltage $V_{OUT}$ has fallen low enough to terminate the non-overlap interval by turning on transistor N10.

The above-described operation of the half-bridge circuit of FIG. 4 is for a condition in which output current $I_{LOAD}$ is flowing outward, i.e., the half-bridge circuit is sourcing output current $I_{LOAD}$ and also in which the transition of output voltage $V_{OUT}$ is from a higher voltage to a lower voltage. At time $t_d$, a non-overlap interval commences for which the direction of output current $I_{LOAD}$ is reversed, i.e., the half-bridge circuit is sinking output current $I_{LOAD}$. The transition of output voltage $V_{OUT}$ is again from a higher voltage to a lower voltage. Under such a condition, output voltage $V_{OUT}$ begins to rise after control signal g has been de-asserted to terminate the fully-on condition of transistor P10 and switches S1A and S2 have been closed, by asserting control signal a and control signal b, respectively at time $t_d$.

Output voltage $V_{OUT}$ rises to exceed power supply voltage $+V_{DD}$ at time $t_e$, which is detected by a comparator K3, which compares output voltage $V_{OUT}$ to power supply voltage $V_{DD}$ and asserts signal over+ if output voltage $V_{OUT}$ is greater than power supply voltage $V_{DD}$. Switch control logic 22, in response to assertion of signal over+, de-asserts control signal b, causing switch S2 to open. Further in response to assertion of signal over+ at time $t_e$, control signal f is asserted, which closes switch S6 to turn transistor N10 fully-on in order to reduce the rise in voltage of $V_{OUT}$ as quickly as possible. The slope-control described above for the "sourcing $I_{LOAD}$" condition using only transistor P10 cannot reduce the increase in output voltage $V_{OUT}$. Control signal d is also asserted at time $t_e$ to close switch S4. Also at time $t_e$, control signal a' is asserted to close switch S1B, which provides for a weak turn-on of transistor P10, so that transistor P10 continues to conduct slightly. At time $t_f$, comparator K3 has detected that output voltage $V_{OUT}$ has fallen back below power supply voltage $+V_{DD}$ and switch control logic 22A de-asserts control signal f to open switch S6 so that transistor N10 is only maintained in a less strongly on-state via switch S4 and resistor R12, which remain active as control signal d remains asserted. Finally, at time $t_g$, comparator K2 has detected that output voltage $V_{OUT}$ has reached a voltage less than threshold voltage $V_{th1}$, in response to which control signal c is asserted to turn off transistor P10, and control signal f is asserted to turn transistor N10 fully-on, terminating the non-overlap interval.

In order to manage conditions under which output current $I_{LOAD}$ has a low magnitude, e.g. 25 mA for the high-to-low output voltage $V_{OUT}$ transition, an additional comparator K4 is included, which compares the gate voltage $V_g$ of transistor P10 to a threshold voltage $V_{th2}$. Since switch S2 is closed at the beginning of the non-overlap cycle, gate voltage $V_g$, will rise and if output voltage $V_{OUT}$ is falling slowly (due to low output current $I_{LOAD}$), comparator K4 will change state, causing a programmable delay one-shot 24A to generate a pulse that is combined by logical-OR gate OR1 with the output of comparator K3 to signal that control signal b should be de-asserted and control signal d asserted, in order to discharge the output of the half-bridge. Operation of comparator K4 and one-shot 24A are not separately illustrated, but operate similar to the right side of FIG. 5, starting at time $t_e$ (sinking output current $I_{LOAD}$ case). Therefore, when comparator K4 triggers one-shot 24A, the operation is the same as when comparator K3 asserts signal over+ as described above.

The circuits illustrated above only show the operation of a portion of the entire output stage slope control circuitry. In an actual implementation, both the positive rail switching transistor, e.g. transistor P10 in FIG. 4, and the negative rail switching transistor, e.g., transistor N10 in FIG. 4 will generally be used to provide output current slope control, depending on the direction of the output current at the beginning of the non-overlap period and the polarity of the voltage that will be applied to the output terminal during next switching cycle. Further, in a full bridge amplifier configuration, all four quadrants will generally include slope control circuitry in accordance with an embodiment of the present invention.

Figure 6:
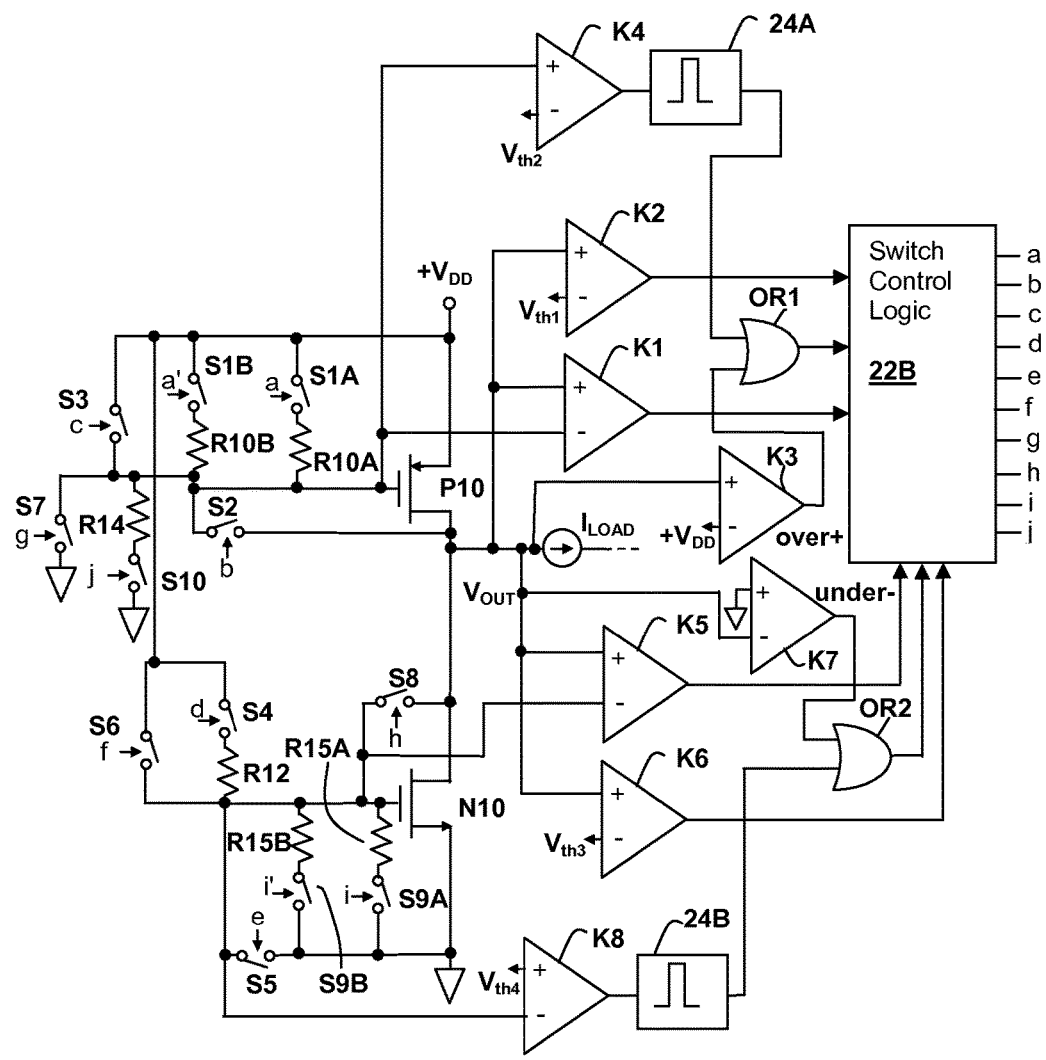
FIG. 6 is a schematic diagram illustrating an output stage of a switching power amplifier circuit in accordance with another embodiment of the present invention.

Referring now to FIG. 6, a half-bridge circuit that forms an output stage of a switching power amplifier in accordance with an embodiment of the present invention, is shown. As with the circuit of FIG. 4, the half-bridge circuit of FIG. 6 may be used in the switching power amplifier of FIG. 1, providing the functions of half-bridge 15A (and also to provide half-bridge 15B) along with the functions of slope control circuit 20. The half-bridge circuit of FIG. 6 is similar to the half-bridge circuit of FIG. 4, so only differences between them will be described below. The half-bridge circuit of FIG. 6 includes additional switches S8, S9A, S9B and S10, that are controlled by corresponding control signals h, i, i' and j, produced by a switch control logic 22B. Switches S8, S9A, S9B and S10 provide for operation of the half-bridge circuit of FIG. 6 in a manner similar to that described above, except that switches S8, S9A, S9B and S10 control the half-bridge circuit under conditions in which the output voltage $V_{OUT}$ is transitioning from a lower voltage to a higher voltage, e.g., a condition under which transistor N10 is fully-on at the beginning of an overlap interval and transistor P10 is fully-off. Switch S8 couples transistor N10 in a diode connected configuration as does switch S2 with respect to transistor P10. Switch S9A provides a connection to ground through a resistor R15A to cause transistor N10 to control a rising slope of output voltage $V_{OUT}$ in the same manner as switch S1A and resistor R1A do for a falling slope. Switch S9B provides a connection to ground through a resistor R15B to provide a weaker turn-on of transistor N10 than does switch S9A. Switch S10 couples the gate of transistor P10 to ground through a resistor R14 to control the discharging of the output terminal when the direction of the output current $I_{LOAD}$ is out (sourcing condition) and the half-bridge output voltage $V_{OUT}$ is transitioning from a lower voltage to a higher voltage (e.g., transistor N10 is turning off and transistor P10 will be turned on). Additional comparators K5, K6, K7 and K8 are provided to perform similar comparisons as comparators K1, K2, K3 and K4, respectively. Comparator K5 compares output voltage $V_{OUT}$ to a gate voltage of transistor N10 in order to determine the condition for opening switch S8 to start the slope control of output voltage $I_{LOAD}$ through resistor R15A and switch S9A. Comparator K6 compares output voltage $V_{OUT}$ to a threshold close to the power supply voltage $+V_{DD}$, to determine when to turn on transistor P10 and turn transistor N10 fully off to terminate the non-overlap interval. Comparator K7 compares output voltage $V_{OUT}$ to a threshold voltage $V_{th4}$ to determine when the direction of output current $I_{LOAD}$ is in the source condition, causing output voltage $V_{OUT}$ to fall below ground, asserting signal under– when such a condition is detected. Comparator K8 detects low output current conditions, e.g., $I_{LOAD}$<10 mA, by comparing the gate voltage of transistor N10 to a threshold voltage $V_{th4}$ close to ground, e.g., 600 mV.

Figure 7:
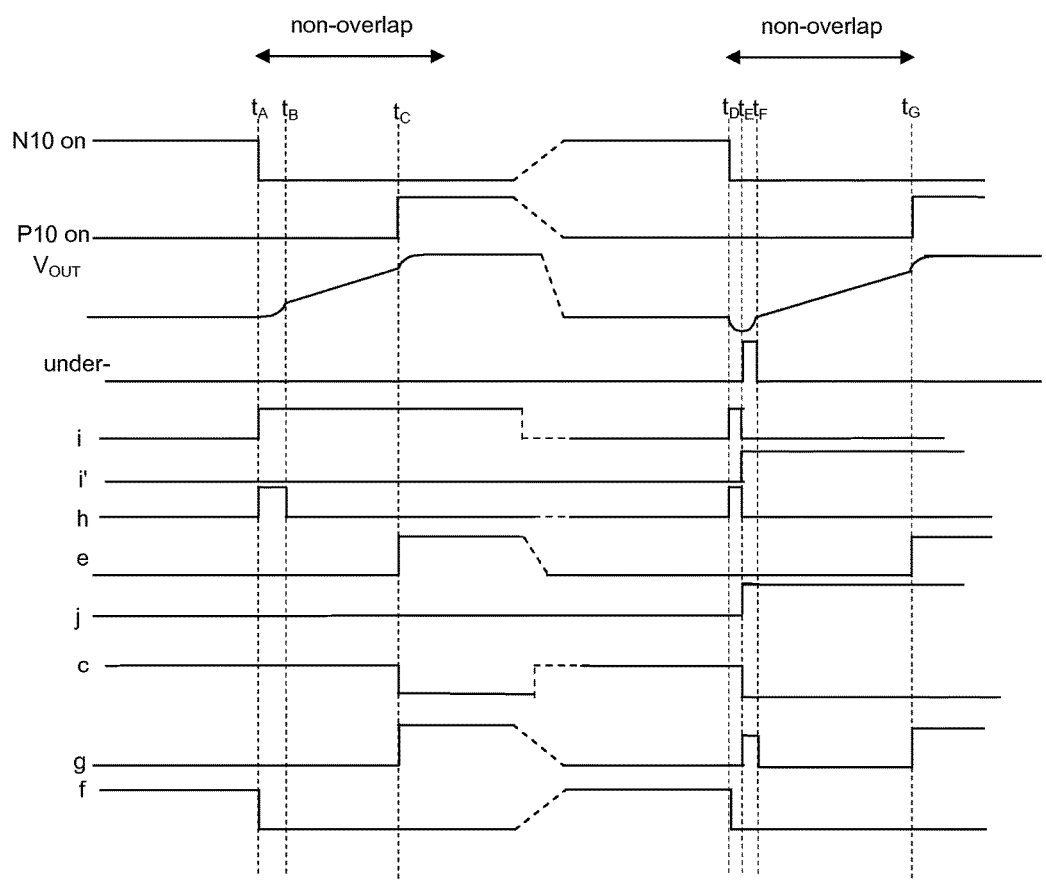
FIG. 7 is a signal waveform diagram depicting signals within the circuit depicted in FIG. 6.

Referring additionally to FIG. 7, operation of the circuit of FIG. 6 is shown in a signal timing and waveform diagram. Only the low-to-high output voltage conditions are illustrated, as the behavior of the circuit of FIG. 6 is the same as the behavior of the circuit of FIG. 4 in the high-to-low output voltage cases, which are illustrated in FIG. 5. Control signals a, a', b and d are not illustrated in FIG. 7, as they are de-asserted during the entirety of the low-to-high transition intervals, just as control signals h, i, i' and j are not asserted during a high-to-low transition interval such as those illustrated in FIG. 5. At time $t_A$, the non-overlap interval begins when the fully-on state of transistor N10 is terminated by de-asserting control signal f to open switch S6. At time $t_A$, control signal c is maintained in an active state to keep transistor P10 turned off during the non-overlap interval. Also at time $t_A$, switch S8 is closed by asserting control signal h, and switch S9A is also closed by asserting control signal i. When output voltage $V_{OUT}$ has risen to a voltage at which comparator K5 changes state at time $t_B$, control signal h is de-asserted to open switch S8, and control signal i remains asserted to keep switch S9A closed so that the slope of output voltage $V_{OUT}$ is controlled by transistor N10 being biased to operate as a current source by resistor R15A. Once comparator K6 changes state, which compares output voltage $V_{OUT}$ to a predetermined threshold voltage $V_{th3}$, that is close to the value of $+V_{DD}$, switch control logic 22B is signaled to assert control signals e and g at time $t_C$, which close switches S5 and S7, respectively. Closing switch S5 pulls the gate of transistor N10 to ground, turning transistor N10 fully off, while closing switch S7 pulls the gate of transistor P10 to ground, turning transistor P10 fully on. Comparator K6 thus provides an indication that output voltage $V_{OUT}$ has risen high enough to terminate the non-overlap interval by turning on transistor P10.

At time $t_D$, a non-overlap interval commences for which the direction of output current $I_{LOAD}$ is reversed, i.e., the half-bridge circuit is sourcing output current $I_{LOAD}$ during a low-to-high transition of output voltage $V_{OUT}$. Under such a condition, output voltage $V_{OUT}$ begins to fall after control signal f has been de-asserted to terminate the fully-on condition of transistor N10, and switches S8 and S9A have been closed, by asserting control signal h and control signal i, respectively at time $t_D$. Output voltage $V_{OUT}$ falls below ground at time $t_E$, which is detected by a comparator K7, which compares output voltage $V_{OUT}$ to ground and asserts signal under– if output voltage $V_{OUT}$ is less than ground. Switch control logic 22B, in response to assertion of signal under–, de-asserts control signal h, causing switch S8 to open and de-asserts control signal i causing switch S9A to open, while asserting control signal i', causing switch 9B to close, placing transistor N10 in a weakly-on condition. Further in response to assertion of signal under-, control signal g is asserted, which closes switch S7 to turn transistor P10 fully-on in order to quickly stop the fall of output voltage $V_{OUT}$. Control signal j is also asserted, closing switch S10. At time $t_F$, comparator K7 determines that output voltage $V_{OUT}$ has risen above ground, in response to which control signal g is de-asserted to leave transistor P10 in a less strongly on-state via switch S10 and resistor R14, which remain active as control signal j remains asserted. Finally, at time $t_G$, comparator K6 has detected that output voltage $V_{OUT}$ has reached a voltage greater than threshold voltage $V_{th3}$, in response to which control signal e is asserted to turn off transistor N10, and control signal g is asserted to turn transistor P10 fully-on, terminating the non-overlap interval.

As in the circuit of FIG. 4, when output current $I_{LOAD}$ has a low magnitude, e.g. <10 mA for the low-to-high output voltage $V_{OUT}$ transition, comparator K8, which compares the gate voltage $V_g$ of transistor N10 to a threshold voltage $V_{th4}$, detects such a condition. Since switch S8 is closed at the beginning of the non-overlap cycle, the gate voltage of transistor N10 will fall and if output voltage $V_{OUT}$ is rising slowly (due to low output current $I_{LOAD}$), comparator K8 will change state, causing a programmable delay one-shot 24B to generate a pulse that is combined by logical-OR gate OR2 with the output of comparator K7 to signal that control signal h should be de-asserted and control signal j asserted, in order to charge the output of the half-bridge. Operation of comparator K8 and one-shot 24B are not separately illustrated, but operate similar to the right side of FIG. 7, in the non-overlap interval starting at time $t_D$ (sourcing output current $I_{LOAD}$ case).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A switched-power circuit, comprising:
   a switching output stage comprising a pair of transistors including a first transistor and a second transistor controlled by a switching control circuit, wherein the switching control circuit controls the pair of transistors such that in a non-overlap time period between a change in polarity of an output voltage of an output terminal of the switching output stage, neither of the pair of transistors is fully on;
   a current source for providing an output current to the output terminal during the non-overlap time period to control the output voltage before the first transistor is turned fully off and before the second transistor is turned on;
   a non-zero resistance coupled between a gate of the first transistor and a drain of the first transistor; and
   a voltage sensing circuit for comparing a voltage of the gate of the first transistor to another voltage level and providing an output signal to an input of the switching control circuit, wherein the output signal provides an indication of a current conducted by the drain of the first transistor.

2. The switched-power circuit of claim 1, wherein the switching control circuit couples the gate and the drain of the first transistor to provide the current source, wherein the voltage sensing circuit compares the voltage of the gate of the first transistor to the output voltage, and wherein the switching control circuit de-couples the gate and the drain of the first transistor to deactivate the current source in response to the output signal.

3. The switched-power circuit of claim 2, wherein the first transistor is operated in a diode configuration during at least a first portion of the non-overlap time period when the switching control circuit couples the gate and drain of the first transistor, and wherein the switching control circuit de-couples the gate and the drain of the first transistor during a second portion of the non-overlap time period, and wherein the switched-power circuit further comprises a circuit for controlling a slope of the output voltage during the second portion of the non-overlap time period.

4. The switched-power circuit of claim 1, further comprising a second voltage sensing circuit having an output coupled to an input of the switching control circuit for comparing the output voltage to a predetermined threshold, wherein the switching control circuit turns off the first transistor and turns on the second transistor to conduct the output current when a magnitude of the output voltage has fallen below the predetermined threshold.

5. The switched-power circuit of claim 1, wherein the voltage sensing circuit is a first voltage sensing circuit, wherein the current source is provided by the first transistor, wherein the switching control circuit sets the gate voltage to cause the first transistor to leave a previously fully on-state at a start of the non-overlap time period, whereby the first transistor begins to turn off, and wherein the switched-power circuit further comprises a second voltage sensing circuit for comparing the output voltage to a predetermined threshold to determine a polarity of the output current from an increase or decrease in a magnitude of the output voltage, and wherein the switching control circuit, in response to the second voltage sensing circuit detecting that the magnitude of the output voltage is increasing, turns on the second transistor so that the second transistor conducts the output current.

6. The switched-power circuit of claim 5, further comprising a third voltage sensing circuit having an output coupled to another input of the switching control circuit for comparing the output voltage to the predetermined threshold, wherein the switching circuit, in response to the second voltage sensing circuit detecting that the magnitude of the output voltage is decreasing, maintains the second transistor in an off condition until the third voltage sensing circuit indicates that the magnitude of the output voltage has fallen below the predetermined threshold, and wherein the switching control circuit turns on the second transistor to conduct the output current.

7. The switched-power circuit of claim 5, wherein the second voltage sensing circuit is a hysteresis comparator or a Schmitt trigger circuit.

8. The switched-power circuit of claim 1, further comprising a circuit for controlling a slope of the output voltage during at least a portion of the non-overlap time period.

9. The switched-power circuit of claim 8, wherein the circuit for controlling the slope of the output voltage comprises a resistor coupled between the gate of the first transistor and a voltage source.

10. The switched-power circuit of claim 8, wherein the circuit for controlling the slope of the output voltage comprises a current source coupled to the gate of the first transistor.

11. The method of claim 8, wherein the controlling the slope of the output voltage comprises coupling a resistor between the gate of the first transistor and a voltage source.

12. A method of operating a switched-power circuit, comprising:
   providing a first current to an output terminal from a switching output stage comprising a pair of transistors including a first transistor and a second transistor coupled in a half-bridge configuration by alternatively operating each of the pair of transistors in a fully-on state except during a non-overlap time period;
   providing a non-zero resistance between a gate of the first transistor and a drain of the first transistor;
   determining an indication of a current conducted by the first transistor by comparing a gate voltage at the gate of the first transistor to another voltage; and
   during the non-overlap time period, providing a second current from a current source to the output terminal to control an output voltage at the output terminal before the first transistor is turned fully off and the second transistor is turned on by the alternatively operating.

13. The method of claim 12, further comprising:
   coupling the first transistor in a diode connected configuration during at least a first portion of the non-overlap time period by coupling the gate and drain of the first transistor; and
   responsive to the indication of current, de-coupling the gate and drain of the first transistor during a second portion of the non-overlap time period to terminate the diode connected configuration.

14. The method of claim 13, wherein the determining the indication of the current conducted by the first transistor compares the voltage at the gate of the first transistor to the another voltage, and wherein the method further comprises:

comparing the output voltage to a predetermined threshold; and turning off the first transistor and turning on the second transistor to conduct the output current when the comparing the voltage at the gate of the first transistor determines that a magnitude of the output voltage has fallen below the predetermined threshold.

15. The method of claim 11, wherein the providing the second current provides the output current from the first transistor, wherein the method further comprises:

setting the gate voltage to cause the first transistor to leave a previously fully on-state at a start of the non-overlap time period, whereby the first transistor begins to turn off;

first comparing the output voltage at the output terminal to the predetermined threshold to determine a polarity of the output current from an increase or decrease in the magnitude of the output voltage; and in response to the first comparing having detected that the magnitude of the output voltage is increasing, turning off the first transistor and turning on the second transistor so that the second transistor conducts the output current.

16. The method of claim 15, further comprising:

second comparing the output voltage to the predetermined threshold; and in response to the first comparing having detected that the magnitude of the output voltage is decreasing, turning on the second transistor to conduct the output current and maintaining the second transistor in an off condition until the second comparing indicates that the magnitude of the output voltage has fallen below the predetermined threshold.

17. The method of claim 16, wherein the providing the second current provides the output current from the first transistor by coupling the first transistor in a diode connected configuration during at least a first portion of the non-overlap time period, and wherein the method further comprises:

third comparing the output voltage at the output terminal to the gate voltage; and in response to the third comparing having detected that the magnitude of the output is less than a magnitude of the gate voltage, de-coupling the gate and the drain of the first transistor.

18. The method of claim 12, wherein the providing the second current provides the current from the first transistor, wherein the method further comprises:

setting the gate voltage to cause the first transistor to leave a previously fully on-state at a start of the non-overlap time period, whereby the first transistor begins to turn off;

first comparing the output voltage at the output terminal to a predetermined threshold to determine a polarity of the output current from an increase or decrease in a magnitude of the output voltage; and in response to the first comparing having detected that the magnitude of the output voltage is increasing, turning off the first transistor and turning on the second transistor so that the second transistor conducts the output current.

* * * * *

UNITED STATES PATENT AND TRADEMARK OFFICE
CERTIFICATE OF CORRECTION

PATENT NO. : 9,590,574 B1  
APPLICATION NO. : 14/176681  
DATED : March 7, 2017  
INVENTOR(S) : Naraghi et al.

Page 1 of 1

It is certified that error appears in the above-identified patent and that said Letters Patent is hereby corrected as shown below:

In the Claims

Claim 15, Column 11, Line 8, "method of claim 11" should be --method of claim 14--.

Signed and Sealed this  
Twenty-ninth Day of May, 2018

Andrei Iancu  
*Director of the United States Patent and Trademark Office*